(12) United States Patent
Katsuro

(10) Patent No.: US 7,813,134 B2
(45) Date of Patent: Oct. 12, 2010

(54) ELECTRIC CONTROL DEVICE AND MANUFACTURING METHOD THEREOF

(75) Inventor: Hajime Katsuro, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/292,057

(22) Filed: Nov. 12, 2008

(65) Prior Publication Data
US 2009/0147482 A1 Jun. 11, 2009

(30) Foreign Application Priority Data
Dec. 11, 2007 (JP) ............... 2007-320024
Aug. 25, 2008 (JP) ............... 2008-215790

(51) Int. Cl.
*H05K 7/20* (2006.01)
(52) U.S. Cl. ............... 361/714; 361/704; 361/707; 361/715; 361/719; 165/80.3; 165/104.33; 165/185
(58) Field of Classification Search ............ 361/679.46, 361/679.54, 688, 689, 702, 704–707, 715–722, 361/730, 734–736, 752, 737–741, 749, 831; 165/80.2, 80.3, 80.4, 104.33, 185; 174/25 R, 174/163, 35 MS, 52.1, 52.4, 35 R; 257/687, 257/679, 712, 713, 718, 719; 455/59, 325
See application file for complete search history.

(56) References Cited

U.S. PATENT DOCUMENTS

| 4,689,721 | A | * | 8/1987 | Damerow et al. ........... 361/707 |
| 4,811,165 | A | * | 3/1989 | Currier et al. ............... 361/716 |
| 4,843,520 | A | * | 6/1989 | Nakatani et al. ............ 361/739 |
| 5,060,113 | A | * | 10/1991 | Jacobs ........................ 361/721 |
| 5,159,751 | A | * | 11/1992 | Cottingham et al. .......... 29/832 |
| 5,978,226 | A | * | 11/1999 | Thomas et al. ............... 361/707 |
| 6,094,349 | A | * | 7/2000 | Fassel et al. ................. 361/704 |
| 6,185,100 | B1 | * | 2/2001 | Bentz et al. .................. 361/704 |
| 6,341,063 | B2 | | 1/2002 | Kinoshita et al. |
| 6,816,377 | B2 | | 11/2004 | Itabashi et al. |
| 7,031,165 | B2 | * | 4/2006 | Itabashi et al. .............. 361/719 |
| 7,190,589 | B2 | * | 3/2007 | Caines et al. ............... 361/707 |
| 7,369,413 | B2 | * | 5/2008 | Caines et al. ............... 361/719 |
| 7,542,294 | B2 | * | 6/2009 | Caines et al. ............... 361/704 |

FOREIGN PATENT DOCUMENTS

| JP | A-2002-271067 | 9/2002 |
| JP | A-2003-037228 | 2/2003 |
| JP | A-2004-274018 | 9/2004 |

* cited by examiner

*Primary Examiner*—Michael V Datskovskiy
(74) *Attorney, Agent, or Firm*—Posz Law Group, PLC

(57) ABSTRACT

An electric component is mounted on a circuit board, and a pre-foamed heat radiating member is applied on the electric component. The circuit board is inserted into a chassis having a box shape with an opening in one side toward an opposite side of the opening. A thickness of the pre-foamed heat radiating member is less than a distance between a front surface of the electric component and an inner surface of the chassis. Thus, the pre-foamed heat radiating member is not removed by scraping when the circuit board is inserted into the chassis. Then, the pre-foamed heat radiating member is heated and expands until the radiating member reaches the chassis, and a heat radiating path between the electric component and the chassis is provided. Therefore, the heat radiating property of the electric component can be increased.

14 Claims, 13 Drawing Sheets

HEAT GENERATING VALUE OF
ELECTRIC COMPONENT

DISTANCE FROM END PORTION
OF CIRCUIT BOARD

US 7,813,134 B2

ELECTRIC CONTROL DEVICE AND MANUFACTURING METHOD THEREOF

CROSS REFERENCE TO RELATED APPLICATION

The present application is based on Japanese Patent Applications No. 2007-320024 filed on Dec. 11, 2007, and No. 2008-215790 filed on Aug. 25, 2008, the disclosures of which are incorporated herein by reference.

FIELD OF THE INVENTION

The present invention relates to an electric control device and a manufacturing method thereof.

BACKGROUND OF THE INVENTION

Conventionally, an electric control device mounted in vehicles holds a circuit board, on which electric components are mounted, in a chassis (casing). The electric components mounted on the circuit board include a component such as a power transistor, which generates heat. Thus, the heat generated from such an electric component needs to be radiated to the outside.

In U.S. Pat. No. 7,031,165 corresponding to JP-A-2003-289191, a heat-generating electric component or a circuit board having the electric component is thermally connected to a chassis through a flexible thermally-conductive material (for example, a gel-like resin material of a silicone system). Thereby, the chassis that holds the circuit board can be used as a heat radiating plate, and heat radiation performance can be increased.

In the conventional electric control device, in order to arrange the flexible thermally-conductive material between the electric component (or the circuit board) and the chassis, the chassis is separated into a case having an opening at a surface parallel to a component mounting surface (or a rear surface thereof) of the circuit board, and a cover for closing the opening of the case, and the circuit board is fixed between the case and the cover. In case that the chassis is separated into the case and the cover, for example, the circuit board is located temporarily in the case, and the thermally-conductive material is applied to the electric component (or the circuit board) and the cover, and then, the opening of the case is closed by the cover so that the thermally-conductive material is disposed between the electric component (or the circuit board) and the chassis.

However, in case that the chassis is separated into the case and the cover, the number of components increases and assembling work thereof becomes necessary, and production costs may increase.

Therefore, it is considered that a chassis which has a box shape with only one side opened for taking out a connecting terminal with an external circuit is structured without forming the opening in the chassis at the surface parallel to the component mounting surface of the circuit board. In the case, the surface for taking out the connecting terminal with the external circuit can be disposed in a direction perpendicular to the component mounting surface of the circuit board, and the circuit board can be inserted into the chassis toward an opposite surface of the opening from the opening for taking out the connecting terminal.

Even if the thermally-conductive material is applied on the electric component (or the circuit board) so as to arrange the thermally-conductive material between the electric component (or the circuit board) and the chassis, the thermally-conductive material may contact with an inner surface of the chassis, and a portion of the thermally-conductive material may be scraped off or dropped off when the circuit board is inserted into the chassis. Thereby, the thermally-conductive material cannot be arranged between the electric component (or the circuit board) and the chassis appropriately, and sufficient heat radiation performance cannot be attained.

SUMMARY OF THE INVENTION

It is an object of the present disclosure to provide an electric control device and a manufacturing method thereof.

According to a first aspect of the present disclosure, a method for manufacturing an electric control device includes mounting an electric component on a circuit board; applying a first pre-foamed heat radiating member on a predetermined surface, the predetermined surface being at least one of a front surface of the electric component and a rear surface of an electric component mounting surface of the circuit board; inserting, into a chassis having a box shape with an opening in one side, the circuit board toward an opposite side of the opening from the opening; and heating the first pre-foamed heat radiating member after inserting of the circuit board into the chassis so that the first pre-foamed heat radiating member foams to be a first foamed heat radiating member, the first foamed heat radiating member expanding until the first foamed heat radiating member reaches an inner surface of the chassis, and forming a first heat radiating path between the electric component and the chassis. A thickness of the first pre-foamed heat radiating member is less than a distance of a space between the front surface of the electric component and the inner surface of the chassis.

In the above configuration, the heat radiating property of the electric component can be increased.

According to a second aspect of the present disclosure, an electric control device includes a circuit board; an electric component mounted on the circuit board; a chassis for holding the circuit board and the electric component, wherein the chassis has a box shape with an opening in one side such that the circuit board is inserted toward an opposite side of the opening from the opening; and a first heat radiating member on a front surface of the electric component. The first heat radiating member extends to and fully contacts an inner surface of the chassis so that a first heat radiating path which reaches the chassis from the front surface of the electric component is provided.

In the above configuration, the heat radiating property of the electric component can be increased.

According to a third aspect of the present disclosure, an electric control device includes a first circuit board; a second circuit board; a first electric component mounted on the first circuit board; a second electric component mounted on the second circuit board; a chassis for holding the first and second circuit boards and the first and second electric components, wherein the chassis has a box shape with an opening in one side such that the first and second circuit boards are inserted toward an opposite side of the opening from the opening; a first heat radiating member on a front surface of the first electric component to face a first inner surface of the chassis; and a second heat radiating member on a front surface of the second electric component to face a second inner surface of the chassis. The first heat radiating member extends to and fully contacts the first inner surface of the chassis at a first side so that a first heat radiating path is provided. The second heat radiating member extends to and fully contacts at least one of the inner surface of the chassis at a second side and a rear surface of the first electric component mounting position of the first circuit board so that a second heat radiating path is provided. The inner surface at the first side and the inner surface at the second side face with the circuit board interposed between the inner surface at the first side and the inner side at the second side.

In the above configuration, the heat radiating property of the electric component can be increased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
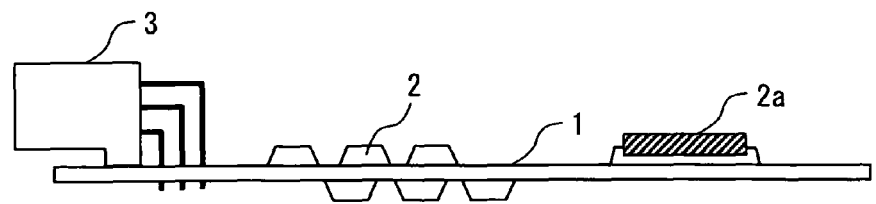
FIGS. 1A to 1C are side views showing manufacturing steps of an electric control device according to a first embodiment.
Figure 1B:
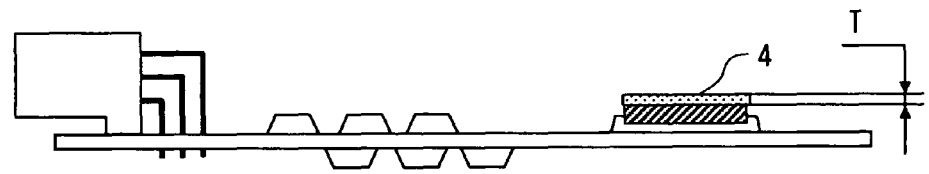
Figure 1C:
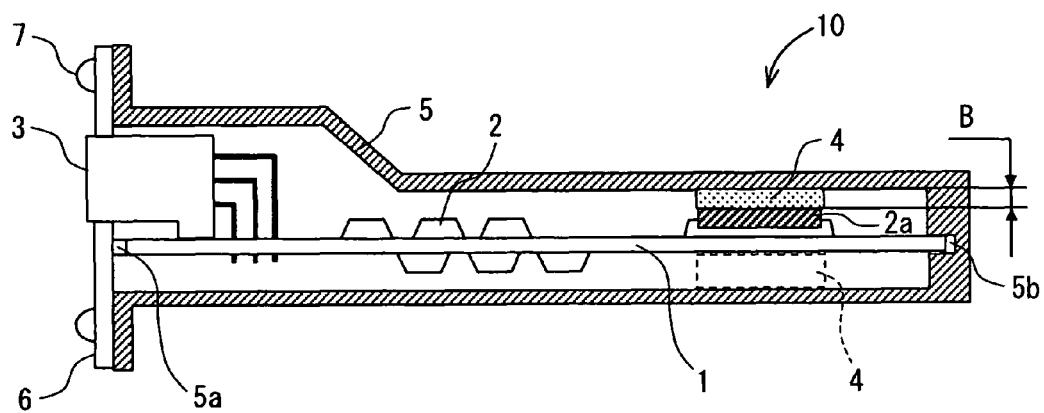

As shown in FIG. 1C, an electric control device 10 includes a chassis configured by a case 5 and a cover 6, a circuit board 1, on which various electric components 2 and a connector 3 are mounted, and a first heat radiating member 4. The circuit board 1 and the heat radiating member 4 are held in the chassis.

The case 5 is made of metal such as aluminum and iron, and has a box shape with only one side (left side in the figure) thereof opened. The opening of the case 5 is substantially rectangular plate-like shape, and the opening is closed by the cover 6, which is made of the same material with the case 5. The case 5 and the cover 6 are jointed by screws 7 so that an internal space, in which the circuit board 1 is held, is structured.

A hole, in which the connector 3 having connecting terminals (not shown) for connecting an electronic circuit formed on the circuit board 1 with an external circuit penetrates, is formed on the cover 6. The connector 3 is disposed through the cover 6 so that the connecting terminals of the connector 3 are exposed to the outside and to be connected to the external circuit. The case 5 and the cover 6 may be made of resin material. The case 5 and the cover 6 may be made of different materials each other.

As described above, the box-shaped case 5 with the one side opened is used in the present embodiment. Thus, compared with the prior art in which the case is separated, the number of components decreases, and the assembly process becomes unnecessary. Therefore, manufacturing cost can be decreased.

The opening of the case 5 is disposed in a direction perpendicular to a component mounting surface in the circuit board 1 so as to take out the connecting terminals of the connector 3 mounted on the circuit board 1 from the opening. Thus, the circuit board 1 is inserted into the case 5 toward a bottom surface (right side surface in the figure) of the case 5 from the opening, that is, toward an opposite side of the opening. Thereby, the circuit board 1 is held inside the case 5. In order to insert the circuit board 1 into the case 5 smoothly, grooves 5a and 5b, each of which has a width corresponding to a thickness of the circuit board 1 and a predetermined depth, are formed at an inner side surface and the bottom surface inside the case 5. The circuit board 1 is inserted into the groove 5a formed at the side surface, and sliding the circuit board 1 until the circuit board 1 fits in the groove 5b formed at the bottom surface. Thereby, the circuit board 1 can be held in a predetermined position of the case 5.

Wiring patterns and via holes for connecting between the wiring patterns or the like, which are not shown, are formed on a front surface (upper surface) and a rear surface (lower surface) of the circuit board 1, and electronic components 2 such as a microcomputer, a power transistor, a resistor and a capacitor are mounted on the circuit board 1. As a material of the circuit board 1, known materials such as thermoplastic resin, thermo-setting resin, ceramic, a composite material of glass (such as glass fabric) and resin can be used.

In the electric components mounted on the circuit board 1, with respect to an electric component 2a, which generates high heat in operating condition, such as a power transistor, the heat radiating member 4 is arranged between the electric component 2a and an inner surface of the case 5. Thereby, the heat generated by the electric component 2a transfers to the case 5 through the heat radiating member 4, and the heat can be released to the outside from the case 5. On a rear surface (lower surface) of the electric component mounting surface of the circuit board 1, a heat radiating member may also be arranged as a second heat radiating member as shown by a dotted line between a region corresponding to the electric component mounting position and the inner surface of the case 5. When the electric component 2a generates heat, the heat also transfers to the circuit board 1. Thus, when the heat radiating member 4 is arranged between the rear surface of the component mounting surface of the circuit board 1 and the inner surface of the case 5, the heat generated by the electric component 2a can be released to the outside from the case 5. The heat radiating member 4 may be arranged between the front surface of the electric component 2a and the inner surface of the case 5, and between the rear surface of the electric component mounting surface of the circuit board 1 and the inner surface of the case 5, respectively.

The heat radiating member 4 is made by mixing foam material uniformly to resin such as silicone. By heating the heat radiating member 4, the foam material foams and volume of the heat radiating member expands. Fine particle such as alumina having high heat transfer property may be contained in the heat radiating member 4.

As the foam material, other than inorganic foam materials such as ammonium hydrogencarbonate and ammonium carbonate, organic foam material and formable ink or the like may be used. Any material can be used as the foam material as long as the foam material foams when heated at temperature above predetermined temperature (for example, about 60 degrees Celsius to 100 degrees Celsius). Furthermore, a microcapsule may be used as the foam material. In the microcapsule, for example, with thermoplastic resin as a shell, gasification material which gasifies at temperature below softening point of the resin is encapsulated inside the shell.

FIG. 1C shows the heat radiating member 4, which expands after the foam material foams. The heat radiating member 4 before foaming by heat (called as a pre-foamed heat radiating member) is applied by pasting on the front surface of the electric component 2a. A thickness T of the applied pre-foamed heat radiating member 4 is set to be less than a distance B corresponding to a space between the front surface of the electric component 2a and the inner surface of the case 5 when the circuit board 1 is held in the case 5.

Next, a manufacturing method of the electric control device 10 will be described with reference to FIG. 1A to FIG. 1C.

Firstly, as shown in FIG. 1A, various electric components 2 including the electric component 2a are mounted on the circuit board 1, on which the wiring patterns and the via holes are formed, by soldering or the like. Moreover, the connector 3 for connecting the electronic circuit formed on the circuit board 1 to the external circuit is formed on the circuit board 1, and the connecting terminals are connected to the wiring patterns.

Next, as shown in FIG. 1B, a pre-foamed heat radiating member 4 is applied on the front surface of the electric component 2a. As described above, the pre-foamed heat radiating member 4 is applied on the front surface of the electric component 2a such that the thickness T of the applied pre-foamed heat radiating member 4 is set to be less than the distance B corresponding to the space between the front surface of the electric component 2a and the inner surface of the case 5.

Thereafter, as shown in FIG. 1C, the circuit board 1, on which the electric components 2 are mounted, is inserted into the case 5 by using the grooves 5a and 5b, which are formed at the side surface and the bottom surface inside the case 5. The insertion continues until an edge portion of the circuit board 1 is fit in the groove 5b at the bottom surface. Thereby, the circuit board 1 can be held in the predetermined position of the case 5.

In the present embodiment, the thickness T of the pre-foamed heat radiating member 4 applied on the front surface of the electric component 2a is less than the distance B corresponding to the space between the front surface of the electric component 2a and the inner surface of the case 5. Thus, when the circuit board 1 is inserted into the inside of the case 5, the pre-foamed heat radiating member 4 does not contact with the inner surface of the case 5, and a portion of the pre-foamed heat radiating member 4 is not removed by scraping or does not drop off.

After the circuit board 1 is held in the predetermined position of the case 5, the pre-foamed heat radiating member 4 is heated, and the foam material mixed into the pre-foamed heat radiating member 4 foams. Thereby, the heat radiating member 4 expands until the heat radiating member 4 reaches the inner surface of the case 5 from the front surface of the electric component 2a, and a radiating path, which reaches the inner surface of the case 5 from the front surface of the electric component 2a, can be formed.

After that, the case 5 and the cover 6 are jointed by the screws 7 so as to close the opening of the case 5 by the cover 6.

Figure 4:
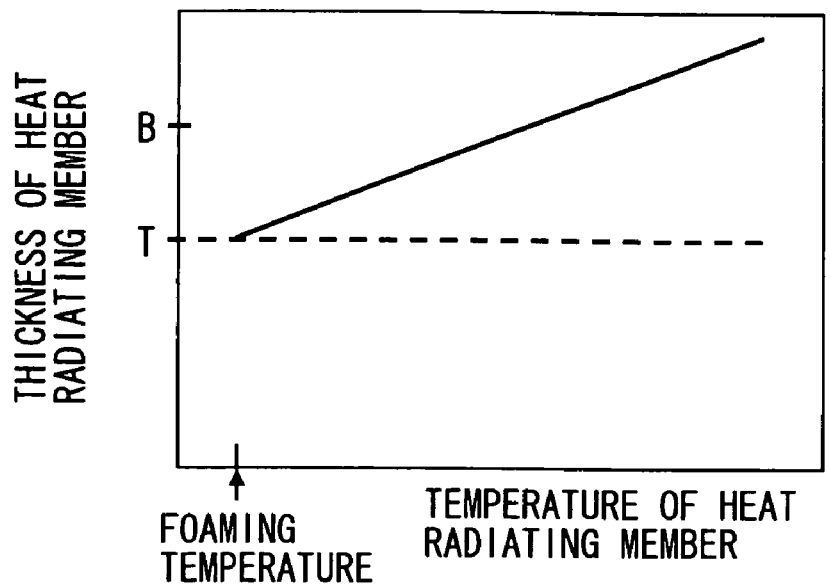
FIG. 4 is a graph showing a relation between a heating temperature and a thickness of a heat radiating member.

As shown in FIG. 4, the pre-foamed heat radiating member 4 has a property that the thickness of the expanded pre-foamed heat radiating member after foaming increases as heating temperature increases above temperature that the foaming material starts to foam (foaming temperature). In FIG. 4, a solid line represents the thickness B of the expanded heat radiating member 4 after foaming, and a broken line represents the application thickness T of the pre-foamed heat radiating member 4. Therefore, if the pre-foamed heat radiating member 4 is heated at excessively high temperature, the electric component 2a may be adversely affected because of the excessive expansion of the pre-foamed heat radiating member 4. On the other hand, the thickness of the expanded pre-foamed heat radiating member 4 barely reaches the inner surface of the case 5 if the heating temperature is low, thereby decreasing heat transfer property between the heat radiating member 4 and the case 5. In other words, in order to ensure the heat transfer property of the radiating path by the heat radiating member 4 sufficiently, the heat radiating member 4 needs to be sufficiently attached to the front surface of the electric component 2a and the inner surface of the case 5.

Figure 2:
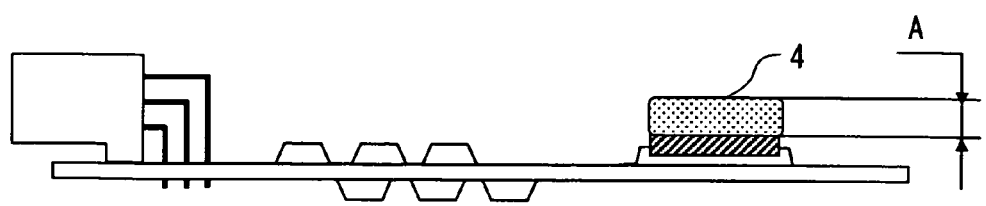
FIG. 2 is a side view showing a thickness of an expanded heat radiating member in case that a pre-foamed heat radiating member foams without a case.
Figure 3:
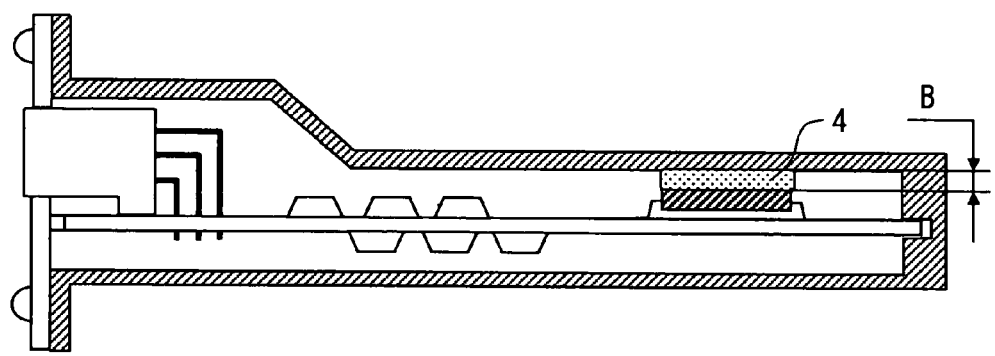
FIG. 3 is a side view showing a thickness of an expanded heat radiating member in case that a pre-foamed heat radiating member foams in a case.

In the present embodiment, the application thickness T and the heating temperature (heating time) of the pre-foamed heat radiating member 4 are set such that the thickness A of the expanded heat radiating member 4, in case that the pre-foamed heat radiating member 4 foams without the case 5 as shown in FIG. 2, becomes larger than the distance B corresponding to the space between the front surface of the electric component 2a and the inner surface of the case 5. Thereby, the heat radiating member 4 after foaming can be sufficiently attached to the front surface of the electric component 2a and the inner surface of the case 5.

However, in case that the thickness of the expanded heat radiating member 4 is excessively large, the electric component 2a may be adversely affected. In the present embodiment, the application thickness A and the heating temperature or the like are set such that compressibility of the heat radiating member 4, that is, $(A-B)/A \times 100$ becomes in a range of 50% to 80%. In the formula, the thickness A represents the expanded heat radiating member 4, in case that the pre-foamed heat radiating member 4 foams without the case 5, and the distance B represents the space between the front surface of the electric component 2a and the inner surface of the case 5. Thereby, the heat radiating member 4 can be sufficiently attached to the front surface of the electric component 2a and the inner surface of the case 5 without affecting the electric component 2a adversely.

The case 5, in which the circuit board 1 is held in the predetermined position, is disposed under high temperature atmosphere such as a furnace so that the pre-foamed heat radiating member 4 can be heated. Alternatively, the pre-foamed heat radiating member 4 may be heated by the heat generated from the electric component 2a in operating condition. In each case, the pre-foamed heat radiating member 4 can be heated to the extent that the pre-foamed heat radiating member 4 can foam.

Figure 5:
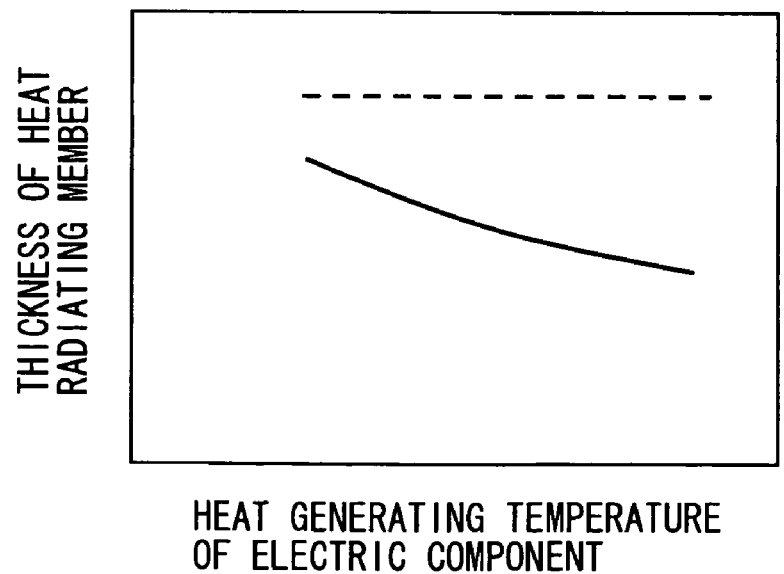
FIG. 5 is a graph showing a relation between a heat generating temperature of an electric component and a thickness of a heat radiating member.
Figure 6A:
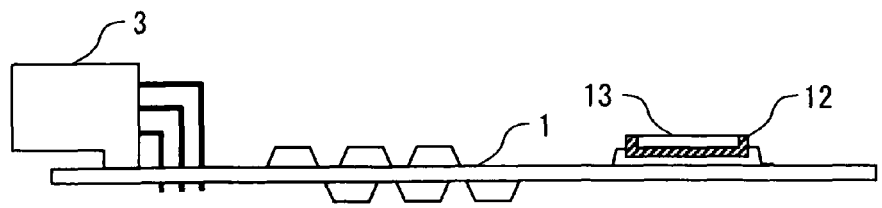
FIGS. 6A to 6C are side views showing manufacturing steps of an electric control device according to a second embodiment.
Figure 6B:
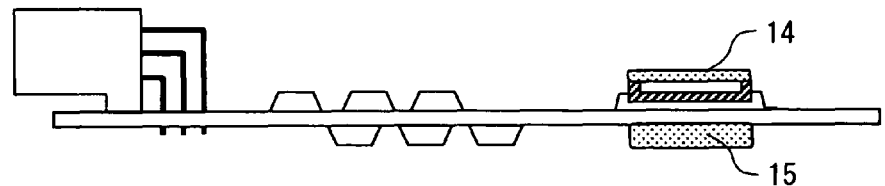
Figure 6C:
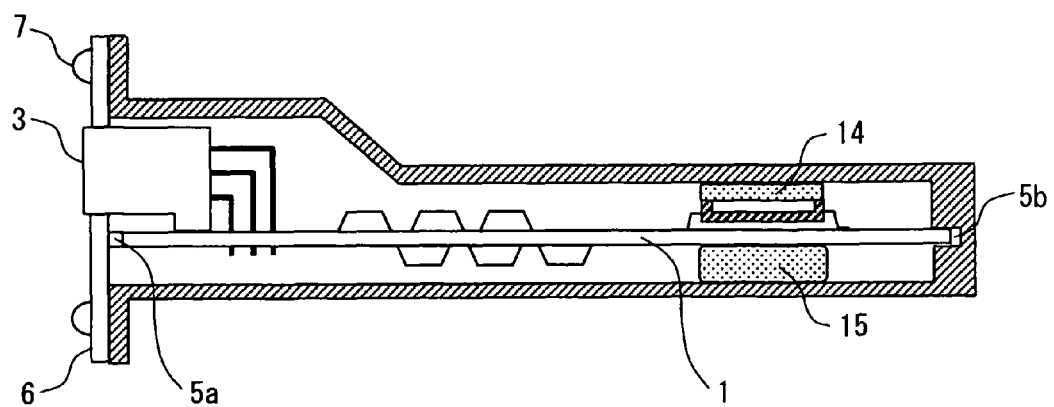

In case that the pre-foamed heat radiating member 4 is heated by the heat due to the operation of the electric component 2a, it is preferable that heat generating temperature of the electric component 2a in operating condition is measured in advance, and the application thickness of the pre-foamed heat radiating member 4 is changed depending on the heat generating temperature. As shown in FIG. 5, the application thickness of the pre-foamed heat radiating member 4 to make the expanded thickness of the heat radiating member 4 after foaming uniform depends on the heat generating temperature of the electric component 2a. Thereby, the expanded thickness of the heat radiating member 4 after foaming can be adjusted appropriately. In FIG. 5, a broken line represents the thickness B of the expanded heat radiating member 4 after foaming, and a solid line represents the application thickness T of the pre-foamed heat radiating member 4.

Second Embodiment

In the first embodiment, the heat radiating member 4 is arranged between the front surface of the electric component 2a and the inner surface of the case 5. In contrast, first and second heat radiating members 14 and 15 are arranged between a front surface of an electric component 12 and the inner surface of the case 5, and between a rear surface of an electric component mounting surface of the circuit board 1 and the inner surface of the case 5. Moreover, the electric component 12, which generates high heat, of the present embodiment includes a heat sink 13 on the front surface of the electric component 12, which is not in contact with the electric component mounting surface of the circuit board 1.

In case that the electric component 12 includes the heat sink 13, heat generated by an operation of the electric component 12 tends to be concentrated at the heat sink 13. Therefore, in case that the heat sink 13 is arranged on the front surface of the electric component 12, a heat radiating path by the heat radiating member 14, which reaches the inner surface of the case 5 from the front surface of the electric component 12, has a function to radiate the heat concentrated at the heat sink 13 mainly. That is, the heat radiating path by the heat radiating member 14 on the front surface of the electric component 12 becomes a main heat radiating path, and the heat radiating path by the heat radiating member 15 on the rear surface of the component mounting surface of the circuit board 1 becomes a sub-heat radiating path.

In the present embodiment, in order to increase a heat radiating property of the main heat radiating path, heating the pre-foamed heat radiating member 14 applied on the front surface of the electric component 12 is performed before heating the pre-foamed heat radiating member 15 applied on the rear surface of the electric component mounting surface of the circuit board 1 is performed.

In this manner, in order to separate the timing of heating each of the pre-foamed heat radiating members 14 and 15, the electric component 12 may be operated, and the pre-foamed heat radiating members 14 and 15 are heated by the heat generated by the operation of the electric component 12, for example. That is, in the present embodiment, the electric component 12 is heated by the operation of the electric component 12, and most of the heat by the operation transfer to the heat sink 13 on the front surface of the electric component 12. Thus, the pre-foamed heat radiating member 14 arranged on the front surface of the electric component 12 is heated earlier than the pre-foamed heat radiating member 15 arranged on the rear surface of the electric component mounting surface of the circuit board 1. That is, in case that the heat sink 13 is arranged on the front surface of the electric component 12, the heat radiating member 14 configuring the main heat radiating path is heated earlier than the heat radiating member 15 configuring the sub-heat radiating path by operating the electric component 12 to heat.

Instead of using the heat generated by the electric component 12 in operating condition so as to heat the pre-foamed heat radiating members 14 and 15, after the circuit board 1 is inserted into the case 5, the pre-foamed heat radiating member 14 on the front surface of the electric component 12 may be heated from the outside, and then, the pre-foamed heat radiating member 15 on the rear surface of the electric component mounting surface of the circuit board 1 may be heated from the outside.

As described above, the pre-foamed heat radiating member 14 on the front surface of the electric component 12 is heated earlier than the pre-foamed heat radiating member 15 on the rear surface of the electric component mounting surface of the circuit board 1, the main heat radiating path, which extends to the inner surface of the case 5 from the electric component 12, is formed, and then, the sub-heat radiating path, which extends to the inner surface of the case 5 from the rear surface of the electric component mounting surface of the circuit board 1, is formed. Thus, when the sub-heat radiating path extending to the inner surface of the case 5 from the rear surface of the electric component mounting surface is formed, force is applied in compression direction to compress the already formed pre-foamed heat radiating member 14, which configures the main heat radiating path. Therefore, compression degree of the heat radiating member 14 and the attaching degree of the heat radiating member 14 with the electric component 12 and the inner surface of the case 5 can be increased.

Figure 7:
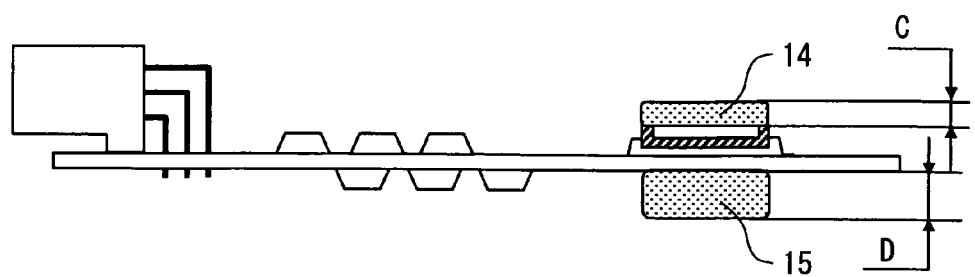
FIG. 7 is a side view showing a thickness of an expanded heat radiating member in case that a pre-foamed heat radiating member foams without a case in the second embodiment.
Figure 8:
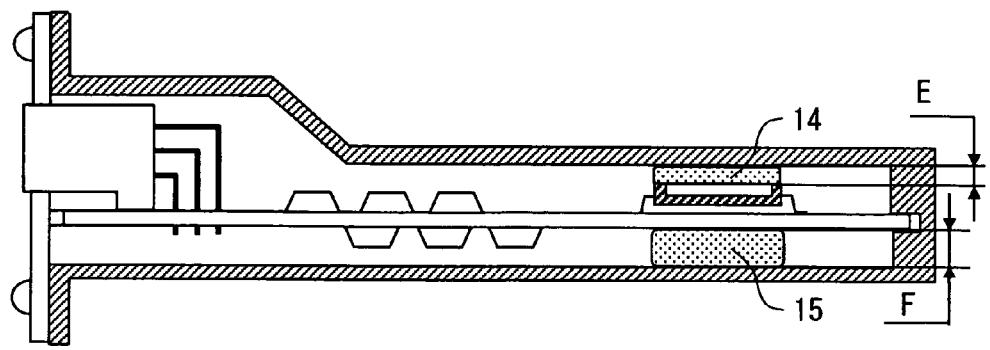
FIG. 8 is a side view showing a thickness of an expanded heat radiating member in case that a pre-foamed heat radiating member foams in a case in the second embodiment.

Moreover, in the present embodiment, the application thicknesses and the heating temperatures of each of the heat radiating members 14 and 15 are set such that compressibility of the heat radiating member 15 reaching the inner surface of the case 5 from the rear surface of the electric component 12 becomes higher than compressibility of the heat radiating member 14 reaching the inner surface of the case 5 from the front surface of the electric component 12 mounting surface of the circuit board 1. Specifically, as shown in FIG. 7 and FIG. 8, compressibility of the heat radiating member 15, that is, $(D-F)/D \times 100$ is higher than compressibility of the heat radiating member 14, that is, (C−E)/C×100. In the formulas, the thickness D represents the expanded heat radiating member 15, in case that the pre-foamed heat radiating member 15 foams without the case 5, and the distance F represents the space between the rear surface of the circuit board 1 and the inner surface of the case 5, the thickness C represents the expanded heat radiating member 14 in case that the pre-foamed heat radiating member 14 foams without the case 5, and the distance E represents the space between the front surface of the electric component 12 and the inner surface of the case 5.

The heat radiating member 14 configuring the main heat radiating path and the heat radiating member 15 configuring the sub-heat radiating path are formed coaxially with the circuit board 1 interposed therebetween. Since the compressibility of the heat radiating member 15 configuring the sub-heat radiating path is high, force can be applied to the heat radiating member 14 configuring the main heat radiating path in the compression direction. Thereby, the heat radiating member 14 configuring the main heat radiating path can be sufficiently compressed, and the heat radiating member 14 can be sufficiently attached to the electric component 12 and the inner surface of the case 5. Therefore, the heat radiating property of the main heat radiating path, which has the function to radiate the heat, and extends to the inner surface of the case 5 from the front surface of the electric component 12, can be increased.

In the present embodiment, the circuit board 1 is interposed between the heat radiating member 14 configuring the main heat radiating path on the electric component mounting surface and the heat radiating member 15 configuring the sub-heat radiating path on the rear surface of the mounting surface of the electric component 12. Thereby, a supporting point of the circuit board 1 increases and this makes the circuit board 1 less likely to generate vibration.

Third Embodiment

Figure 9A:
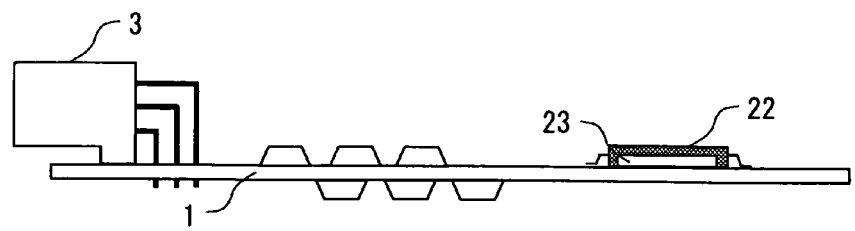
FIGS. 9A to 9C are side views showing manufacturing steps of an electric control device according to a third embodiment.
Figure 9B:
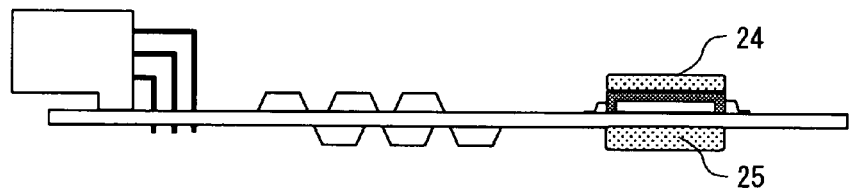
Figure 9C:
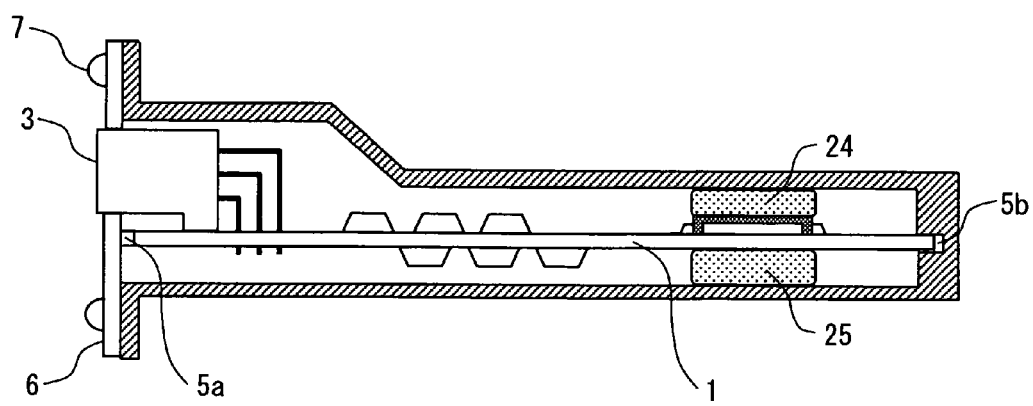

In the second embodiment, the electric component 12 includes the heat sink 13 on the front surface of the electric component 12, which is not in contact with the electric component mounting surface of the circuit board 1. In contrast, in the present embodiment, as shown in FIG. 9A to FIG. 9C, an electric component 22 includes a heat sink 23 on a rear surface of the electric component 22, which faces the mounting surface of the circuit board 1.

In case that the electric component 22 includes the heat sink 23 on the rear surface of the electric component 22, a heat radiating path by a heat radiating member 25, which reaches the inner surface of the case 5 from the rear surface of the electric component mounting surface of the circuit board 1, has a function to radiate heat concentrated at the heat sink 23 mainly. That is, in the present embodiment, the heat radiating path by the heat radiating member 25 on the rear surface of the electric component mounting surface of the circuit board 1 becomes a main heat radiating path, and a heat radiating path by a heat radiating member 24 on the front surface of the electric component 22 becomes a sub-heat radiating path.

In the present embodiment, heating the pre-foamed heat radiating member 25 applied on the rear surface of the electric component mounting surface of the circuit board 1 is performed before heating the pre-foamed heat radiating member 24 applied on the front surface of the electric component 22. Thus, when the sub-heat radiating path extending to the inner surface of the case 5 from the front surface of the electric component 22 is formed, force is applied in compression direction to compress the already formed pre-foamed heat radiating member 25, which configures the main heat radiating path. Therefore, compression degree of the heat radiating member 25 and the attaching degree of the heat radiating member 25 with the circuit board 1 and the inner surface of the case 5 can be increased.

Figure 10:
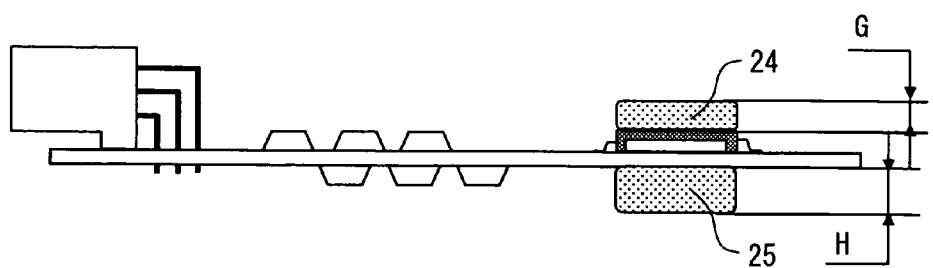
FIG. 10 is a side view showing a thickness of an expanded heat radiating member in case that a pre-foamed heat radiating member foams without a case in the third embodiment.
Figure 11:
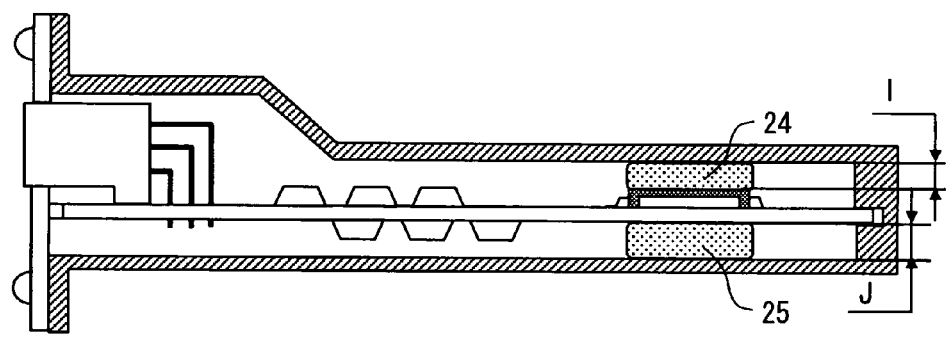
FIG. 11 is a side view showing a thickness of an expanded heat radiating member in case that a pre-foamed heat radiating member foams in a case in the third embodiment.

Moreover, in the present embodiment, the application thicknesses and the heating temperatures of each of the heat radiating members 24 and 25 are set such that compressibility of the heat radiating member 24 reaching the inner surface of the case 5 from the front surface of the electric component 22 becomes higher than compressibility of the heat radiating member 25 reaching the inner surface of the case 5 from the rear surface of the electric component mounting surface of the circuit board 1. Specifically, as shown in FIG. 10 and FIG. 11, compressibility of the heat radiating member 24, that is, (G−I)/G×100 is higher than compressibility of the heat radiating member 25, that is, (H−J)/H×100. In the formulas, the thickness G represents the expanded heat radiating member 24, in case that the pre-foamed heat radiating member 24 foams without the case 5, and the distance I represents the space between the front surface of the electric component 22 and the inner surface of the case 5, the thickness H represents the expanded heat radiating member 25 in case that the pre-foamed heat radiating member 25 foams without the case 5, and the distance J represents the space between the rear surface of the circuit board 1 and the inner surface of the case 5.

Thereby, the heat radiating member 25 configuring the main heat radiating path can be sufficiently compressed, and the heat radiating member 25 can be sufficiently attached to the circuit board 1 and the inner surface of the case 5. Therefore, the heat radiating property of the main heat radiating path, which has the function to radiate the heat, and extends to the inner surface of the case 5 from the rear surface of the electric component mounting surface of the circuit board 1, can be increased.

In the third embodiment, since the circuit board 1 is interposed between the heat radiating member 24 configuring the sub-heat radiating path and the heat radiating member 25 configuring the main heat radiating path as well as the second embodiment, resistance to vibration of the circuit board 1 can be improved.

Fourth Embodiment

Figure 12:
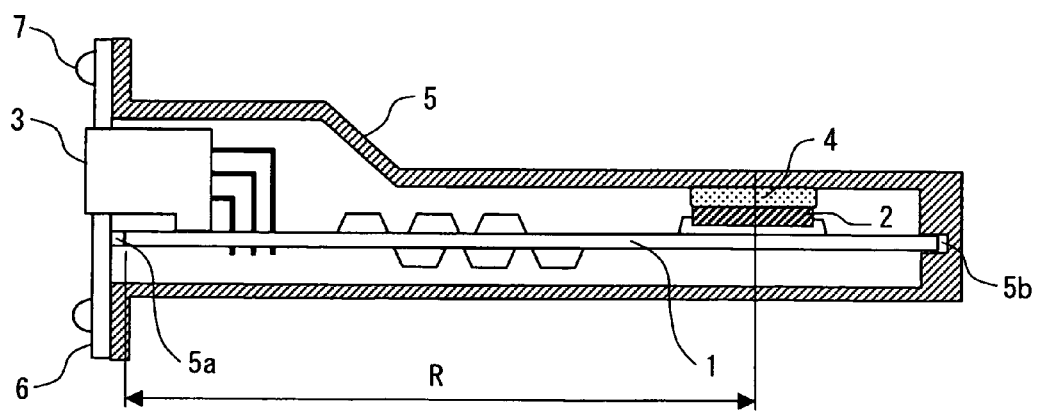
FIG. 12 is a side view showing a position of a component which is mounted in an electric control device of a fourth embodiment.

As shown in FIG. 12, in case that a heat radiating member 4 is arranged between a case 5 and a circuit board 1, since coefficient of thermal expansion, i.e., CTE, of the case 5 is higher than CTE of the circuit board 1, shear force is applied to the heat radiating member 4 due to the difference of elongations in each of the circuit board 1 and the case 5. When the shear force is applied to the heat radiating member 4, a position of the heat radiating member 4 becomes out of alignment and heat radiating property of the heat radiating member 4 may decrease. The farther the position from an end portion of the circuit board 1 at the opening becomes, the stronger the shear force becomes.

Figure 13:
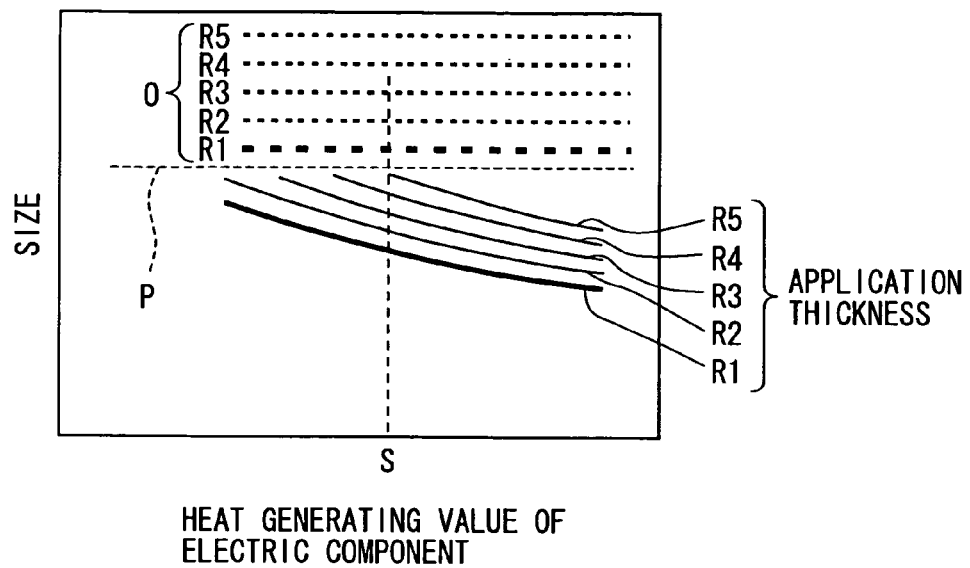
FIG. 13 is a graph showing a relationship between a distance from an end portion of a circuit board and a size of a heat radiating member in the electric control device according to the fourth embodiment.
Figure 14:
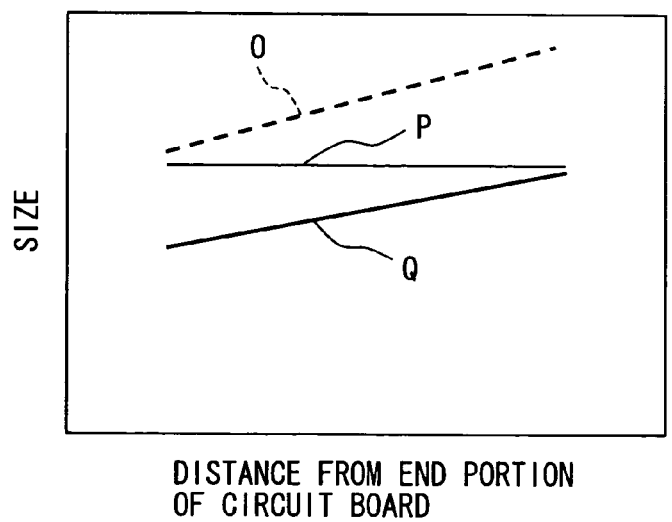
FIG. 14 is a graph showing a relationship between a distance from the end portion of the circuit board and the size of the heat radiating member at temperature S in the electric control device according to the fourth embodiment.

In the present embodiment, as shown in FIG. 13 and FIG. 14, application quantity of the pre-foamed heat radiating member is changed according to a distance R between the end portion of the circuit board 1 at the opening and an electric component 2, on which the heat radiating member 4 is disposed. That is, with respect to heat generating value of the electric component and temperature of the heat radiating member (heating temperature), the application thickness of the heat radiating member 4 is increased with distance from the end portion of the circuit board 1. In FIG. 13, each of R1 to R5 represents a distance from the end portion of the circuit board at the opening, and the order of nearest to farthest from the end portion of the circuit board 1 is R1, R2, R3, R4, R5. In FIG. 13 and FIG. 14, O represents a thickness of the heat radiating member after foaming, P represents a distance between the electric component and the inner surface of the chassis, and Q represents an application thickness at temperature S.

Thereby, repulsion force of the heat radiating member 4 can be stronger at the position that the shear force becomes stronger (farther position from the end portion of the circuit board). Therefore, the heat radiating member 4 can exceed the shear force due to the difference between CTE of the circuit board 1 and CTE of the case 5, and a misalignment of the position of the heat radiating member 4 can be restricted.

Fifth Embodiment

Figure 15:
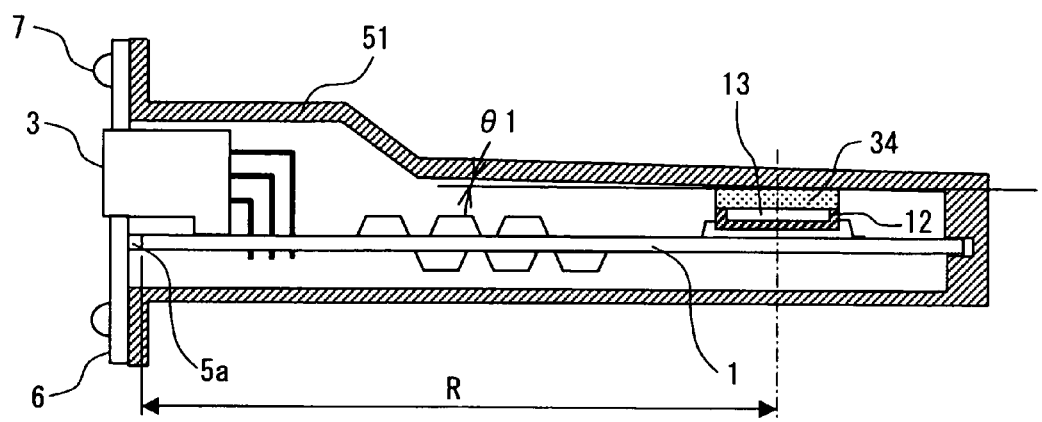
FIG. 15 is a side view showing a structure of a case in an electric control device according to a fifth embodiment.
Figure 16:
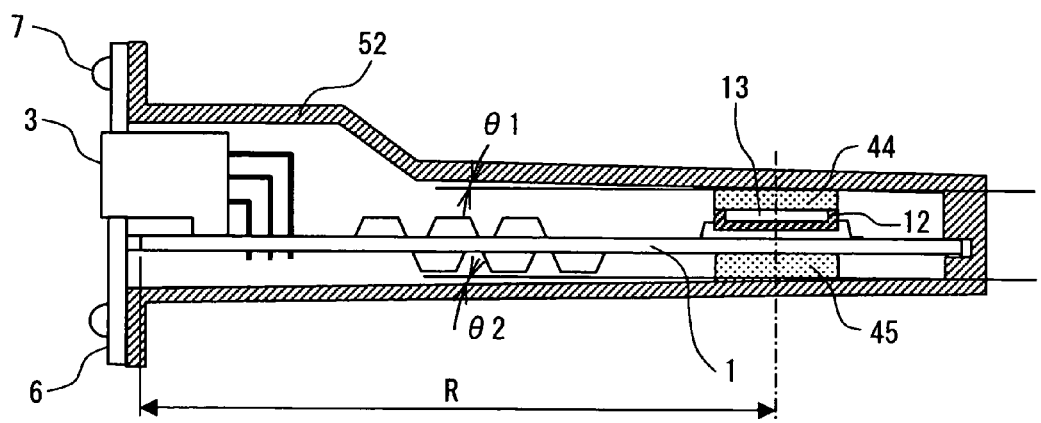
FIG. 16 is a side view showing a structure of a case in an electric control device according to a modification of the fifth embodiment.

As shown in FIG. 15 and FIG. 16, in case that a heat radiating member 34 is arranged between a case 51 and the circuit board 1, and in case that heat radiating members 44 and 45 are arranged between a case 52 and the circuit board 1, since coefficient of thermal expansion, i.e., CTE, of the case 51 and CTE of the case 52 are higher than CTE of the circuit board 1, shear force is applied to the heat radiating members 34, 44 and 45 due to the difference of elongations in each of the circuit board 1 and the cases 51 and 52. When the shear force is applied to the heat radiating members 34, 44 and 45, positions of each of the heat radiating members 34, 44 and 45 are out of alignment and heat radiating properties of each of the heat radiating members 34, 44 and 45 may decrease. The farther the position from an end portion of the circuit board 1 at the opening becomes, the stronger the shear force becomes.

In the present embodiment, distances between the electric component 12 and an inner surface of each of the cases 51 and 52 and a distance between a rear surface of an electric component mounting surface and the inner surface of each of the cases 51 and 52 become shorter with distance from the end portion of the circuit board 1.

For example, as shown in FIG. 15, a slope of an angle θ1 is provided at the inner surface of the case 51, the inner surface which faces the electric component 12. The heat radiating member 34 is disposed on a front surface of the electric component 12. Alternatively, as shown in FIG. 16, a slope of an angle θ1 is provided at the inner surface of the case 52 facing the electric component 12 and a slope of an angle θ2 is provided at the inner surface of the case 52 facing the rear surface of the electric component mounting surface. The heat radiating member 44 is disposed on the front surface of the electric component 12, and the heat radiating member 45 is disposed on a region corresponding to the electric component mounting position in the rear surface of the electric component mounting surface of the circuit board 1.

Thereby, repulsion force of the heat radiating members 34, 44 and 45 can be stronger with distance from the end portion of the circuit board. Therefore, the heat radiating members 34, 44 and 45 can exceed the shear force due to the difference between CTE of the circuit board 1 and CTE of each of the cases 51 and 52, and a misalignment of the positions of the heat radiating members 34, 44 and 45 can be restricted.

Figure 17:
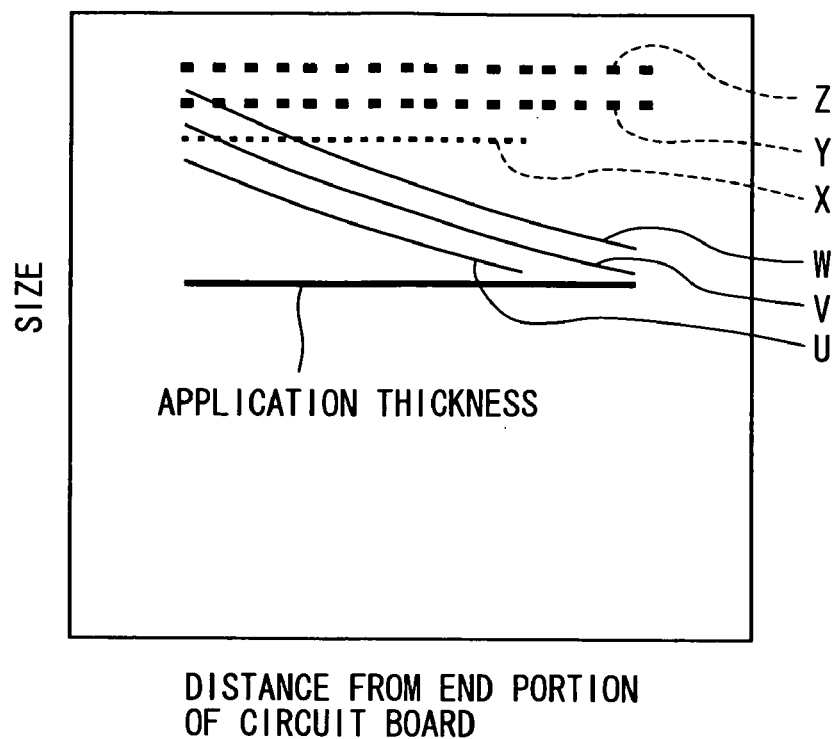
FIG. 17 is a graph showing a relationship between a distance from an end portion of a circuit board and a size of a heat radiating member in the electric control device according to the fifth embodiment.

Moreover, as shown in FIG. 17, the angle of the slope of the chassis may be decided depending on the temperature of the electric component 12, by changing the distance between the electric component 12 and the inner surface of the case or the distance between the rear surface of the electric component mounting surface and the inner surface of the case. In FIG. 17, U represents a distance between the electric component and the inner surface of the chassis at temperature a, V represents a distance between the electric component and the inner surface of the chassis at temperature b, and W represents a distance between the electric component and the inner surface of the chassis at temperature c. In addition, X represents a thickness of the heat radiating member after foaming at temperature a, Y represents a thickness of the heat radiating member after foaming at temperature b and Z represents a thickness of the heat radiating member after foaming at temperature c.

In the present embodiment, although the feature that the slope is provided at the inner surface of the cases 51 and 52 is described, a different configuration may be taken. In the present embodiment, distance between the inner surface of the case and the front surface of the electric component and the distance between the rear surface of the electric component mounting surface and the inner surface of the case become shorter as the distance between the electric component, on which the heat radiating member is disposed, and the end portion of the circuit board at the opening become larger. For example, a step may be disposed on the inner surface of the case.

Sixth Embodiment

In the first to fifth embodiments, the number of the circuit board 1 held in the chassis is one. In contrast, as shown in FIG. 18A to FIG. 18D, multiple circuit boards 11a and 11b, which are connected by a flexible substrate 11c, may be held in one chassis.

Figure 18A:
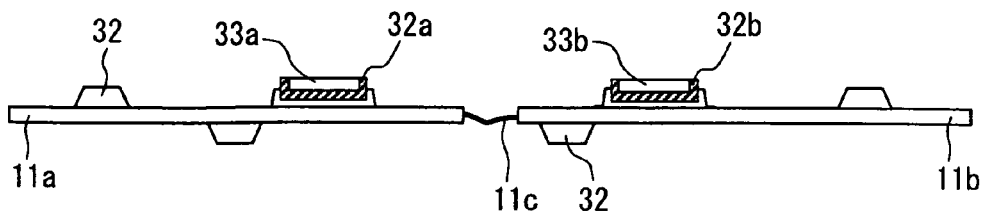
FIGS. 18A to 18D are side views showing manufacturing steps of an electric control device according to a sixth embodiment.
Figure 18B:
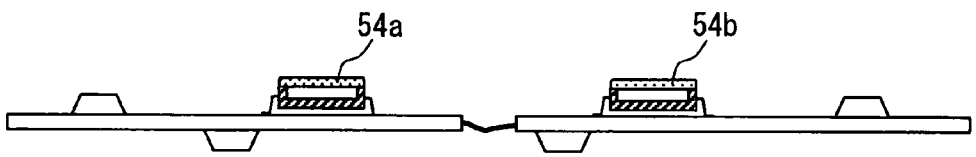
Figure 18C:
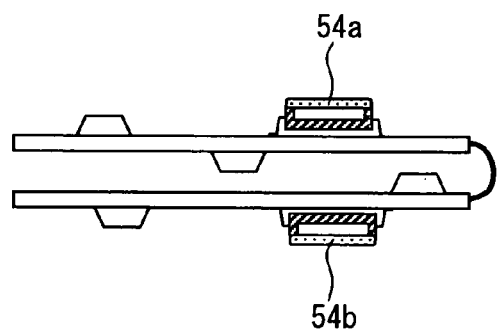
Figure 18D:
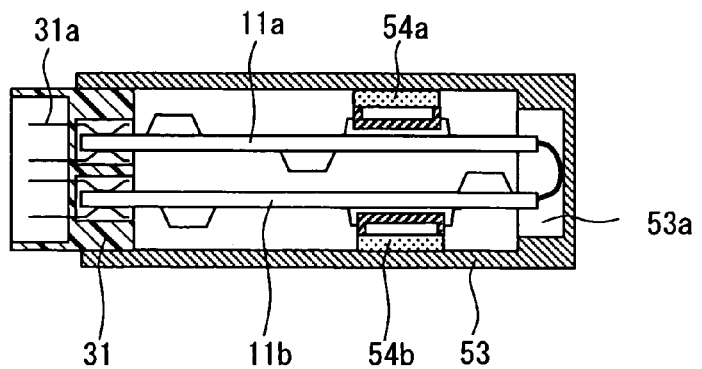

As shown in FIG. 18D, an electric control device includes the chassis configured by a case 53 and a connector 31, rigid circuit boards 11a and 11b, which mounts thereon various electric components 32, 32a and 32b, and heat radiating members 54a and 54b as shown in FIG. 18A. The circuit boards 11a and 11b and the heat radiating members 54a and 54b are held in the chassis.

The case 53 configuring the chassis is made of metal such as aluminum and iron as well as the case in the above embodiments, and has a box shape with only one side thereof opened. The opening of the case 53 is closed by the connector 31. The case 53 and the connector 31 are jointed by a known joint so that an internal space, in which the circuit boards 11a and 11b are held, is structured.

Connecting terminals (not shown) of the circuit boards 11a and 11b are inserted into one end portion of the connector 31. Terminals 31a exposed to the outside are formed at another end portion of the connector 31, so that the circuit boards 11a and 11b can be connected to an external circuit. The case 53 may be made of resin material.

As described above, the box-shaped case 53 with the one side opened is used in the present embodiment. Thus, compared with the prior art in which the case is separated, the number of components decreases, and the assembly process becomes unnecessary. Therefore, manufacturing cost can be decreased.

The circuit boards 11a and 11b are inserted into the case 53 toward a bottom surface (right side surface in the figure) from the opening of the case 53, and the circuit boards 11a and 11b are held inside the case 53. In order to insert the circuit boards 11a and 11b into the case 53 smoothly, grooves, which have widths corresponding to thicknesses of the circuit boards 11a and 11b and predetermined depths, are formed at a side surface inside the case 53 in the similar manner as in the first embodiment. The circuit boards 11a and 11b are inserted into the grooves formed at the side surface of the case 53, so that the circuit boards 11a and 11b can be held in a predetermined position of the case 53. In addition, an open space 53a for holding the flexible substrate 11c is formed at a bottom surface of the case 53.

Wiring patterns and via holes for connecting between the wiring patterns or the like, which are not shown, are formed on front surfaces and rear surfaces of the circuit boards 11a and 11b, and electronic components 32 such as a microcomputer, a power transistor, a resistor and a capacitor are mounted on the circuit boards 11a and 11b. As a material of the circuit boards 11a and 11b, known materials such as thermoplastic resin, thermo-setting resin, ceramic, a composite material of glass (such as glass fabric) and resin can be used.

In the electric components mounted on the circuit boards 11a and 11b, with respect to the electric components 32a and 32b, which generate high heat in operating condition, such as power transistors, heat sinks 33a and 33b are arranged on each of the electric components 32a and 32b, and heat radiating members 54a and 54b are arranged between each of the electric components 32a and 32b and an inner surface of the case 53. The circuit boards 11a and 11b are held in the case 53 with the circuit boards 11a and 11b facing each other. Thereby, the heat generated by the electric components 32a and 32b transfers to the case 53 through the heat radiating members 54a and 54b, and the heat can be released to the outside from the case 53.

A manufacturing method of the electric control device having the above structure will be described. Firstly, as shown in FIG. 18A, the multiple circuit boards 11a and 11b, which are connected by the flexible substrate 11c, are prepared. Next, as shown in FIG. 18B, pre-foamed heat radiating members 54a and 54b are applied on surfaces of each of the electric components 32a and 32b before inserting the circuit board 11a and 11b into the case 53. Then, as shown in FIG. 18C, the circuit boards 11a and 11b are made to face each other. Next, as shown in FIG. 18D, the circuit boards 11a and 11b, which face each other, are inserted into the grooves formed at the side surface of the case 53, the connector 31 is inserted into the case 53 with the circuit boards 11a and 11b pinched by the terminals 31a, and the connector 31 is fixed in the case 53. After that, the electric components 32a and 32b are operated, and the pre-foamed heat radiating members 54a and 54b foam so that heat radiating paths are formed between the case 53 and each of the electric components 32a and 32b. Thereby, the heat generated from the electric components 32a and 32b transfers to the case 53 and the temperature thereof is lowered.

Seventh Embodiment

Figure 19A:
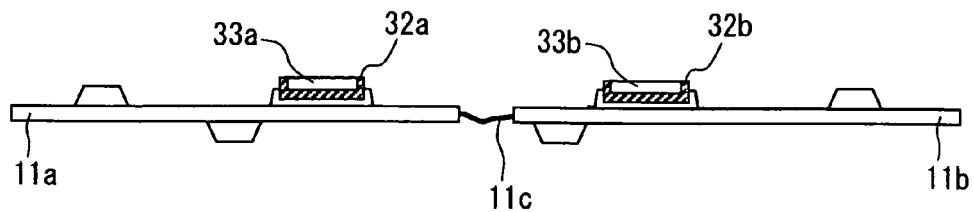
FIGS. 19A to 19D are side views showing manufacturing steps of an electric control device according to a seventh embodiment.
Figure 19B:
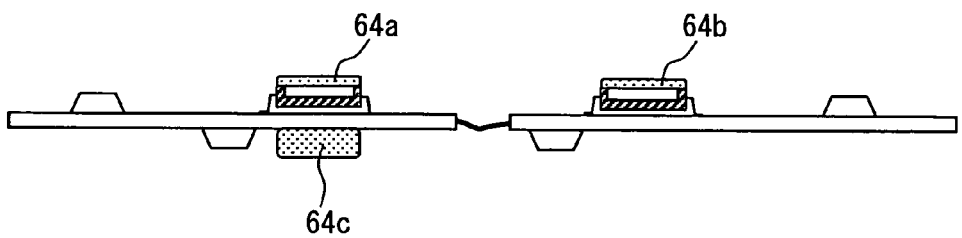
Figure 19C:
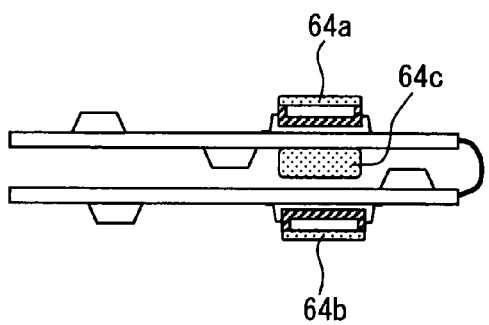
Figure 19D:
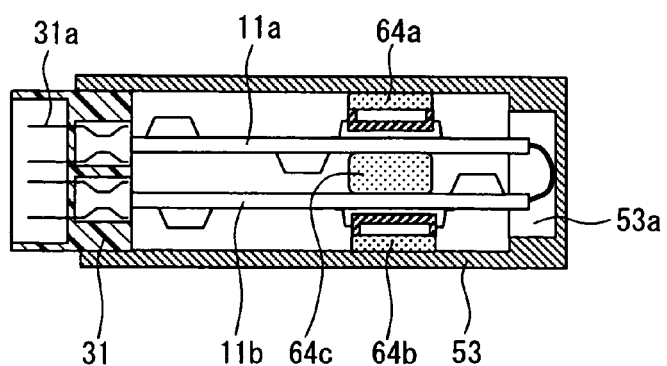

In contrast to the sixth embodiment, as shown in FIG. 19D, heat radiating members 64a and 64b are arranged between a case 53 and each of electric components 32a and 32b, and further, a heat radiating member 64c may be arranged between rear faces of electric component mounting surfaces of the circuit boards 11a and 11b.

A manufacturing method of the electric control device having the structure will be described. Firstly, as shown in FIG. 19A, the multiple circuit boards 11a and 11b, which are connected by the flexible substrate 11c, are prepared. Next, as shown in FIG. 19B, pre-foamed heat radiating members 64a, 64b and 64c are applied on surfaces of each of the electric components 32a and 32b and a front surface of the circuit board 11a (corresponding to a mounting position of the electric component 32b at a rear surface of the component mounting surface of the circuit board 11a) before inserting the circuit boards 11a and 11b into the case 53.

Then, as shown in FIG. 19C, the circuit boards 11a and 11b are made to face each other. Next, as shown in FIG. 19D, the circuit boards 11a and 11b, which face each other, are inserted into the grooves formed at the side surface of the case 53, the connector 31 is inserted into the case 53 with the circuit boards 11a and 11b pinched by the terminals 31a, and the connector 31 is fixed in the case 53. After that, the electric components 32a and 32b are operated, and the pre-foamed heat radiating members 64a, 64b and 64c foam so that heat radiating paths are formed between the case 53 and each of the electric components 32a and 32b and between the circuit board 11a and the circuit board 11b.

The electric components 32a and 32b mounted on the circuit boards 11a and 11b are heated, and a portion of the heat transfers to the circuit boards 11a and 11b. The heat radiating path surrounded by the rear surfaces of the component mounting surfaces of the circuit boards 11a and 11b and the inner surface of the case 53 radiates the heat transferred to the circuit boards 11a and 11b.

In case that the heat radiating paths, which are formed between front surfaces of each of the electric components 32a and 32b and the inner surface of the case 53 and between the rear surface of the mounting surface of the circuit board 11a and the rear surface of the mounting surface of the circuit board 11b, are formed, the heat radiating paths for radiating the heat generated by the electric components 32a and 32b can be increased, and heat radiating property can be further increased.

In the present embodiment, the circuit board 11a is interposed between the heat radiating member 64a configuring the heat radiating path on the front surface of the component mounting surface and the heat radiating member 64c configuring the heat radiating path on the rear surface of the component mounting surface, and the circuit board 11b is interposed between the heat radiating member 64b configuring the heat radiating path on the front surface of the component mounting surface and the heat radiating member 64c configuring the heat radiating path on the rear surface of the component mounting surface. Thereby, a supporting point of the circuit boards 11a and 11b increases and this makes the circuit boards 11a and 11b less likely to generate vibration.

Eighth Embodiment

Figure 20A:
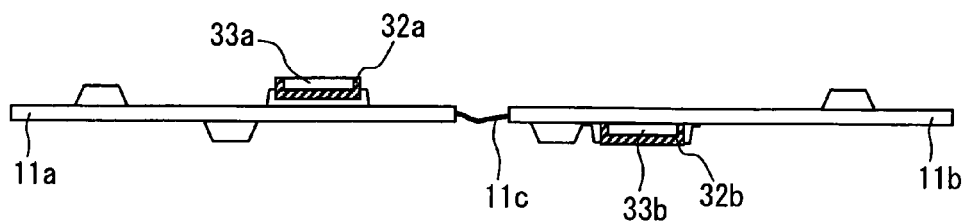
FIGS. 20A to 20D are side views showing manufacturing steps of an electric control device according to an eighth embodiment.
Figure 20B:
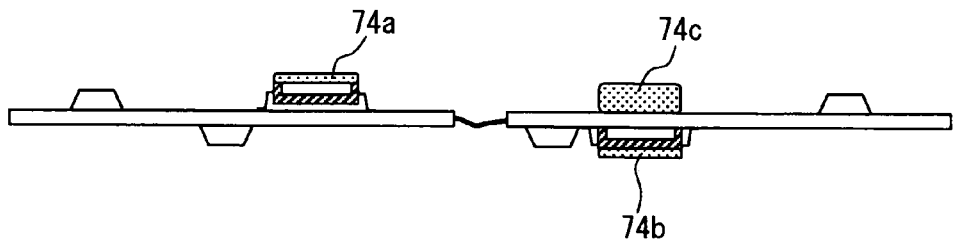
Figure 20C:
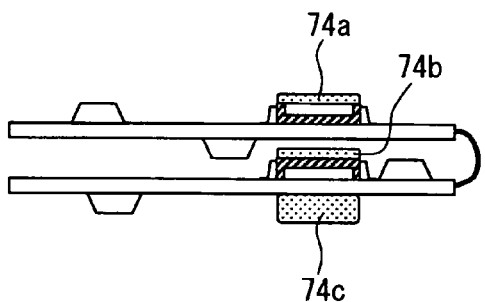
Figure 20D:
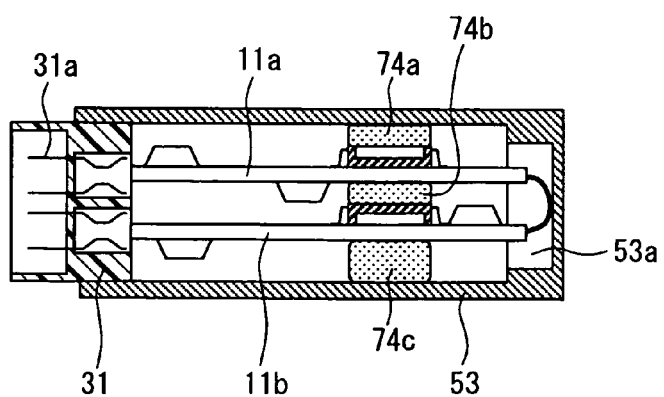

In contrast to the seventh embodiment, as shown in FIG. 20D, a heat radiating member 74a may be arranged between the electric component 32a and the inner surface of the case 53, a heat radiating member 74b may be arranged between the electric component 32b and the circuit board 11a, and a heat radiating member 74c may be arranged between the circuit board 11b and the inner surface of the case 53.

In manufacturing the electric control device, as shown in FIG. 20A, the multiple circuit boards 11a and 11b, which are connected by the flexible substrate 11c, are prepared. Next, as shown in FIG. 20B, pre-foamed heat radiating members 74a, 74b and 74c are applied on surfaces of each of the electric components 32a and 32b and a front surface of the circuit board 11a (corresponding to a mounting position of the electric component 32b at a rear surface of the component mounting surface of the circuit board 11a) before inserting the circuit boards 11a and 11b into the case 53.

Then, as shown in FIG. 20C, the circuit boards 11a and 11b are made to face each other. Next, as shown in FIG. 20D, the circuit boards 11a and 11b, which face each other, are inserted into the grooves formed at the side surface of the case 53, the connector 31 is inserted into the case 53 with the circuit boards 11a and 11b pinched by the terminals 31a, and the connector 31 is fixed in the case 53. After that, the electric components 32a and 32b are operated, and the pre-foamed heat radiating members 74a, 74b and 74c foam so that heat radiating paths are formed between the case 53 and each of the electric components 32a and 32b and between the circuit board 11b and the case 53.

In case that the heat radiating paths, which are formed between the electric component 32a and the case 53, between the electric component 32b and the circuit board 11a, and between the circuit board 11b and the case 53, are formed, the heat radiating paths for radiating the heat generated by the electric components 32a and 32b can be increased, and heat radiating property can be further increased.

Moreover, the circuit board 11a is interposed between the heat radiating member 74a and the heat radiating member 74b, and the circuit board 11b is interposed between the heat radiating member 74b and the heat radiating member 74c. Thereby, a supporting point of the circuit boards 11a and 11b increases and this makes the circuit boards 11a and 11b less likely to generate vibration.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electric control device comprising:
    a circuit board;
    an electric component mounted on the circuit board;
    a chassis for holding the circuit board and the electric component, wherein the chassis has a box shape with an opening in one side such that the circuit board is inserted toward an opposite side of the opening from the opening;
    a first heat radiating member on a front surface of the electric component, and
    a second heat radiating member on a rear surface of an electric component mounting position of the circuit board, wherein
    the first heat radiating member extends to and fully contacts an inner surface of the chassis so that a first heat radiating path which reaches the chassis from the front surface of the electric component is provided, and
    the second heat radiating member extends to and fully contacts the inner surface of the chassis so that a second heat radiating path which reaches the chassis from the rear surface of the electric component mounting position of the circuit board is provided.

2. The electric control device according to claim 1, further comprising:
    a heat sink on the front surface of the electric component, the heat sink being not in contact with the electric component mounting position,
    wherein compressibility of the second heat radiating member is higher than compressibility of the first heat radiating member.

3. The electric control device according to claim 1, further comprising:
    a heat sink on a rear surface of the electric component, the heat sink faces the electric component mounting position,
    wherein compressibility of the first heat radiating member is higher than compressibility of the second heat radiating member.

4. The electric control device according to claim 1,
    wherein the chassis is provided such that the longer a distance between the electric component and an end portion of the circuit board at an opening becomes, the shorter a distance between the front surface of the electric component and the inner surface of the chassis becomes.

5. The electric control device according to claim 1,
    wherein the chassis is provided such that the longer a distance between the electric component and an end portion of the circuit board at an opening becomes, the shorter a distance between the rear surface of the electric compound mounting position of the circuit board and the inner surface of the chassis becomes.

6. The electric control device according to claim 1,
    wherein the chassis is provided such that the longer a distance between the electric component and an end portion of the circuit board at an opening becomes, the shorter a distance between the inner surface of the chassis at a first side and the inner surface of the chassis at a second side by providing a slope at the inner surface of the chassis,
    wherein the inner surface at the first side and the inner surface at the second side face with the circuit board interposed between the inner surface at the first side and the inner side at the second side.

7. An electric control device comprising:
    a first circuit board;
    a second circuit board;
    a first electric component mounted on the first circuit board;
    a second electric component mounted on the second circuit board;
    a chassis for holding the first and second circuit boards and the first and second electric components, wherein the chassis has a box shape with an opening in one side such that the first and second circuit boards are inserted toward an opposite side of the opening from the opening;
    a first heat radiating member on a front surface of the first electric component to face a first inner surface of the chassis; and
    a second heat radiating member on a front surface of the second electric component to face a second inner surface of the chassis,
    wherein the first heat radiating member extends to and fully contacts the first inner surface of the chassis at a first side so that a first heat radiating path is provided,
    wherein the second heat radiating member extends to and fully contacts at least one of the inner surface of the chassis at a second side and a rear surface of a first electric component mounting position of the first circuit board so that a second heat radiating path is provided, and
    wherein the inner surface at the first side and the inner surface at the second side face the first and second circuit boards interposed between the inner surface at the first side and the inner side at the second side.

8. The electric control device according to claim 7, further comprising:
    a third heat radiating member,
    wherein the third heat radiating layer is disposed at least one of between an opposite surface of the first electric component mounting position in the rear surface of the first circuit board and an opposite surface of a second electric component mounting position in a rear surface of the second circuit board and between the inner surface of the chassis at the second side and the opposite surface of the second electric component mounting position in the rear surface of the second circuit board.

9. The electric control device according to claim 7,
wherein the first circuit board and the second circuit board are connected by a flexible substrate, and
wherein the first circuit board and the second circuit board are held in the chassis while facing each other.

10. An electric control device comprising:
a circuit board;
an electric component mounted on the circuit board;
a chassis for holding the circuit board and the electric component, wherein the chassis has a box shape with an opening in one side such that the circuit board is inserted toward an opposite side of the opening from the opening; and
a first heat radiating member on a front surface of the electric component, wherein
the first heat radiating member extends to and fully contacts an inner surface of the chassis so that a first heat radiating path which reaches the chassis from the front surface of the electric component is provided,
the chassis is provided such that the longer a distance between the electric component and an end portion of the circuit board at an opening becomes, the shorter a distance between the inner surface of the chassis at a first side and the inner surface of the chassis at a second side by providing a slope at the inner surface of the chassis, and
the inner surface at the first side and the inner surface at the second side face the circuit board interposed between the inner surface at the first side and the inner side at the second side.

11. The electric control device according to claim 10, further comprising:
a second heat radiating member on a rear surface of an electric component mounting position of the circuit board,
wherein the second heat radiating member extends to and fully contacts the inner surface of the chassis so that a second heat radiating path which reaches the chassis from the rear surface of the electric component mounting position of the circuit board provided.

12. The electric control device according to claim 11, further comprising:
a heat sink on the front surface of the electric component, the heat sink not being in contact with the electric component mounting position,
wherein compressibility of the second heat radiating member is higher than compressibility of the first heat radiating member.

13. The electric control device according to claim 11, further comprising:
a heat sink on a rear surface of the electric component, the heat sink facing the electric component mounting position,
wherein compressibility of the first heat radiating member is higher than compressibility of the second heat radiating member.

14. The electric control device according to claim 7, wherein
the chassis is provided such that the longer a distance between the first electric component and an end portion of the first circuit board at an opening and a distance between the second electric component and an end portion of the second circuit board at the opening becomes, the shorter a distance between the inner surface of the chassis at the first side and the inner surface of the chassis at the second side by providing a slope at the inner surface of the chassis, and
the inner surface at the first side and the inner surface at the second side face the first and second circuit boards interposed between the inner surface at the first side and the inner surface at the second side.

* * * * *